(12) United States Patent  
Ulrich et al.

(10) Patent No.: US 7,511,890 B2
(45) Date of Patent: Mar. 31, 2009

(54) REFRACTIVE OPTICAL IMAGING SYSTEM, IN PARTICULAR PROJECTION OBJECTIVE FOR MICROLITHOGRAPHY

(75) Inventors: Wilhelm Ulrich, Aalen (DE); David Shafer, Fairfield, CT (US); Dieter Bader, Obergroeningen (DE); Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 292 days.

(21) Appl. No.: 11/347,316

(22) Filed: Feb. 6, 2006

(65) Prior Publication Data
US 2006/0198028 A1    Sep. 7, 2006

Related U.S. Application Data

(60) Provisional application No. 60/649,556, filed on Feb. 4, 2005.

(51) Int. Cl.
*G02B 9/00* (2006.01)
(52) U.S. Cl. .................. 359/649; 359/648; 359/754
(58) Field of Classification Search .......... 359/754, 359/649–651, 648
See application file for complete search history.

(56) References Cited

U.S. PATENT DOCUMENTS

| 4,770,513 | A | * | 9/1988 | Fujie et al. | 359/649 |
| 5,052,763 | A | | 10/1991 | Singh et al. | |
| 5,257,139 | A | | 10/1993 | Higuchi | |
| 5,513,041 | A | * | 4/1996 | Togino | 359/631 |
| 6,461,908 | B2 | | 10/2002 | Stolk et al. | |

FOREIGN PATENT DOCUMENTS

WO    WO 2005/096098 A2    10/2005

OTHER PUBLICATIONS

Erhard Glatzel, New Lenses for Microlithography, International Lens Design Conference, 1980, pp. 310-320, SPIE vol. 237, Oberkochen, West Germany.

* cited by examiner

*Primary Examiner*—Scott J Sugarman
(74) *Attorney, Agent, or Firm*—Sughrue Mion, PLLC

(57) ABSTRACT

A refractive optical imaging system for imaging an object field arranged in an object surface of the imaging system into an image field arranged in an image surface of the imaging system on a demagnifying imaging scale has a multiplicity of optical elements which are configured and arranged such that a defined finite field curvature of the imaging system is set such that an object surface concavely curved relative to the imaging system is imaged into a flat image surface.

19 Claims, 3 Drawing Sheets ically designed
REFRACTIVE OPTICAL IMAGING SYSTEM, IN PARTICULAR PROJECTION OBJECTIVE FOR MICROLITHOGRAPHY This application claims benefit from U.S. provisional application No. 60/649,556 filed Feb. 4, 2005, the disclosure of which is incorporated herein by reference.

BACKGROUND OF THE INVENTION

1. Field of the Invention

The invention relates to a refractive optical imaging system for imaging an object field arranged in an object surface of the imaging system into an image field arranged in the image surface of the imaging system on a demagnifying imaging scale. The preferred field of application of the invention is projection objectives for microlithography. An imaging system according to the invention can be used as projection objective for microlithography or as imaging subsystem within a projection objective for microlithography.

2. Description of related art

Photolithographic projection objectives with a demagnifying imaging scale (reduction objectives) have been used for several decades for the photolithographic fabrication of semiconductor components and other finely patterned devices. They serve for projecting the pattern of a mask, e.g. of a photomask or of a reticle, onto an article coated with a light-sensitive layer with very high resolution on a demagnifying scale.

Conventional projection systems are designed to image a planar mask onto a flat image field. Accordingly, measures for correcting the field curvature (Petzval correction) are provided in the projection objectives.

To date, purely refractive (dioptric) projection objectives have been predominantly used in optical lithography. These are distinguished by a mechanically relatively simple, centered design that has only a single, unfolded optical axis. Furthermore, use can be made of object fields that are centered on the optical axis and which minimize the photoconductance to be corrected and simplify an adjustment of the objective. The correction of the field curvature lends the objective a characteristic waist structure and gives rise to large overall lengths and large maximum lens diameters, the result of which is to raise the level of the blank mass (mass of the parts of lens material required to produce the lens). Known measures for flattening the image field in the case of refractive optical imaging systems are described in the article entitled "New Lenses for Microlithography" by E. Glatzel in: SPIE vol. 237 (1980), pages 310-320.

A simpler correction of the field curvature, and a possibility of chromatic correction, are reached in the case of catadioptric systems, which have at least one catadioptric objective part with a concave mirror. Here, the Petzval correction (correction for field curvature) is achieved by the curvature of the concave mirror and negative lenses in its vicinity.

The patent U.S. Pat. No. 5,052,763 gives a description of a catadioptric projection objective with an intermediate image in the case of which the image of the object field (intermediate image) produced by a first, catadioptric subsystem is imaged into the image plane with the aid of a second, refractive subsystem. In order to be able to image a planar object into a flat image surface, the Petzval sum of the system is obtained by using the second subsystem to compensate the field curvature produced by the first subsystem, a curved intermediate image surface being produced. The input-end and exit-end subsystems are corrected separately for odd aberrations, such as coma or distortion. Even aberrations such as spherical aberration, astigmatism and field curvature, by contrast, are corrected by compensation between the subsystems. The curved intermediate image is therefore not corrected with regard to these aberrations.

For projection lithography onto curved substrates, the U.S. Pat. No. 6,461,908 B1 proposes using a curved mask whose form is identical to the form of the curved substrate. The curved mask is produced in a contact method. Curvature-conforming imaging of the curved mask onto the curved substrate requires projection objectives with a substantial correction of the field curvature.

The U.S. Pat. No. 5,257,139 discloses a purely reflective reduction objective for extreme ultraviolet radiation (EUV), wherein the object surface and/or the image surface are curved concavely with respect to the projection objective.

In order to be able to produce ever finer structures, there is on the one hand an attempt to enlarge ever further the image-side numerical aperture (NA) of the projection objectives. On the other hand, use is being made of ever shorter wavelengths, in particular UV light with wavelengths of less than 260 nm, for example 248 nm, 193 nm or 157 nm. In this wavelength region, only a few sufficiently transparent materials still remain for producing the optical components, in particular synthetic quartz glass and fluoride crystals, such as calcium fluoride. The fluoride crystal materials are available in suitable quality only to a very restricted extent. Consequently, the aim is objective designs with a low requirement for high-quality lens material.

SUMMARY OF THE INVENTION

It is one object to provide a purely refractively designed optical imaging system that enables very high image-side numerical apertures, for example $NA \geq 0.85$ in conjunction with a compact, low-mass design. It is another object to provide an optical imaging system which can be utilized as a projection objective for microlithography or as an imaging subsystem inside a projection objective for microlithography.

To address these and other objects the invention, in accordance with one formulation of the invention, a refractive optical imaging system is provided for imaging an object field arranged in an object surface of the imaging system into an image field arranged in the image surface of the imaging system on a demagnifying imaging scale, the imaging system having a multiplicity of optical elements which are configured and arranged such that a defined finite field curvature of the imaging system is set such that an object surface concavely curved relative to the imaging system is imaged into a flat image surface.

The imaging system is therefore distinguished in that a predetermined, finite value is provided for the field curvature in order intentionally to enable a noncurvature-conforming or curvature-altering imaging between the curved object surface and the flat image surface or image plane, which is optically conjugate thereto. The imaging system can be corrected with regard to all field-dependent aberrations with the exception of field curvature. It is preferably also well corrected with regard to field-independent aberrations such as spherical aberration, and so essentially only the field curvature remains as an uncorrected aberration.

The object surface has an object surface curvature that is concave relative to the imaging system, while the image surface is substantially flat. For refractive imaging systems, this sense of curvature corresponds to the "natural" sense of curvature of the object surface of an imaging system, not corrected, or not fully corrected with reference to field curvature, with a flat image surface. In the case of purely refractive imaging systems, the requirement for a virtually complete correction of the field curvature (Petzval correction) is a task that can be solved only with effort. An imaging system in which the requirement for the correction of the field curvature is substantially relaxed can, by contrast, be provided while saving on lens material with good imaging properties.

As is known, the field curvature, dependent only on the radii of the refracting surfaces and the refractive indices of the optical elements, with astigmatism eliminated and correction of the remaining aberrations, leads to the punctiform imaging of an object plane that is orthogonal to the optical axis onto a curved image surface, the peak curvature of which is referred to as the Petzval curvature. The Petzval curvature is proportional to the Petzval sum $1/R_P$, the reciprocal of which is the Petzval radius $R_P$.

The field curvature for an image field of image field radius BR and the Petzval radius $R_p$ can be parameterized by the deviation s', measured in an axially parallel fashion, of the curved image surface from a plane, situated perpendicular to the optical axis and tangent to the image surface at the optical axis, at the edge of the image field. It holds here for this axial deviation measured at the edge of the image field that:

$$s' = |R_p| - \sqrt{R_p^2 - BR^2}.$$

Conventional systems are set to a value of the Petzval sum as close as possible to 0, so that the Petzval radius $R_P$ should be infinite, and thus the axial deviation s' measured at the edge of the image field should be close to 0. The Petzval correction, i.e. the correction of the field curvature, is typically performed such that the magnitude of the axial deviation s' is small in relation to the depth of focus DOF, e.g. in accordance with |s'|<0.5 DOF. As is known, the depth of focus is proportional to $\lambda/NA^2$, where $\lambda$ is the operating wavelength and NA is the image-side numerical aperture of the imaging system. Imaging systems according to the invention deviate substantially from this design goal with regard to the correction of the field curvature, so that a bias of the field curvature is created. In advantageous embodiments of imaging systems according to the invention, by contrast, the axial deviation s' is large in relation to the depth of focus, for example in accordance with |s'|>50. DOF, in particular in accordance with |s'|>100. DOF or in accordance with |s'|>500. DOF.

In the case of imaging systems according to the invention, the Petzval radius corresponds for a flat image surface to a curved object surface whose radius of curvature is denoted below as object surface radius of curvature OFCR. The curved object surface of object surface radius OR preferably has a finite object surface radius of curvature OFCR for at least one direction perpendicular to the optical axis for which it holds that: $OFCR_{min} \leq OFCR \leq OFCR_{max}$. Here, the minimum object surface radius of curvature $OFCR_{min}$ preferably lies in the range between 1.5*OR and 2*OR. The maximum surface radius of curvature $OFCR_{max}$ is substantially smaller than that of a nominally flat object surface. It preferably holds that $6*OR \leq OFCR_{max} \leq 60*OR$.

In one embodiment, the imaging system has a first lens group, of negative refractive power, immediately following the image surface, a second lens group, of positive refractive power, immediately following the first lens group, a third lens group, of positive refractive power, immediately following the second lens group, and a system aperture which is arranged in a transitional region from the second lens group to the third lens group. The imaging system does not have a true, pronounced waist, that is to say it has no substantial constriction in the beam diameter, between object surface and image plane. In particular, a minimum lens diameter $D_{min}$ can be greater than 80%, or even greater than 90%, of the object field diameter OD=2*OR. This renders possible axially compact imaging systems whose overall length L (axial distance between object surface and image plane) is preferably smaller than three times the maximum lens diameter used.

The large potential for saving on lens material is also to be seen in that in preferred embodiments with NA≧0.8, the number NL of the lenses is 15 or less, in which case preferably NL≦13, in particular NL≦10.

In order to avoid the production of aberrations at the entry to the imaging system, it is provided in one preferred embodiment that a first optical element following the object surface has a convex entrance surface relative to the object surface. The radius of curvature R1 of the entrance surface preferably lies in the region of the object surface radius of curvature OFCR, the radius of curvature R1 preferably fulfilling the following condition: OFCR+20%≧R1≧OFCR−20%. The first optical element is preferably a meniscus lens, in particular a negative meniscus lens, that produces a suitable expansion of the beam path in the event of small aberration contributions.

Imaging systems according to the invention can be used, for example, in the field of microscopy. A preferred field of application is projection objectives for microlithography. Well-correctable projection objectives are possible in the context of the invention, and can achieve very high numerical apertures in conjunction with a compact design and low consumption of lens material. There are embodiments which are designed as "dry objectives". Dry objectives are distinguished by the fact that they are designed for a gas-filled gap to be present during operation between the exit side of the projection objective and the coupling-in surface of an article to be exposed, for example a wafer, the gap width of said gap typically being significantly greater than the operating wavelength. In the case of such systems, the numerical apertures that can be achieved are restricted to values of NA<1, since, when approaching the value NA=1, total reflection conditions occur at the exit surface and prevent illumination light from being coupled out from the exit surface. In preferred embodiments of dry systems, the image-side numerical aperture is NA>0.8, NA≧0.85 or NA≧0.9 also being possible.

Projection objectives designed as immersion objectives are also possible in the context of the invention. In the case of immersion lithography, as is known, the resolution that can be achieved in an exposure process is improved by introducing an immersion medium having a high refractive index, for example an immersion liquid having a refractive index $n_I$>1.3 at the operating wavelength, into the space between the last optical element of the projection objective and the substrate. Projection objectives or images having an image-side numerical aperture NA>1.0 are possible as a result, preferably NA≧1.1 or NA≧1.2 or NA≧1.3 being possible.

The optical construction also permits a use for contactless near field projection lithography. In this case, it is possible for sufficient light energy to be coupled into the substrate to be exposed via a gas-filled gap if a sufficiently small image-side operating distance is complied with on average over time. Said operating distance should be less than four times the operating wavelength used, in particular less than the operating wavelength. It is particularly favorable for the operating distance to be less than half of the operating wavelength, for example less than a third, a quarter or a fifth of the operating wavelength. Given these short operating distances, imaging in the optical near field may be effected in the case of which evanescent fields that exist in direct proximity to the last optical surface of the imaging system are utilized for imaging. Such projection objectives are also known as "solid immersion objectives".

The above and further features emerge not only from the claims but also from the description and the drawings, in which case the individual features may be realized in each case on their own or as a plurality in the form of subcombinations in an embodiment of the invention and in other fields and may represent advantageous and intrinsically protectable embodiments.

DETAILED DESCRIPTION OF PREFERRED EMBODIMENTS

Aspects of the invention are described below with the aid of embodiments of refractive imaging systems that are designed as projection objectives for microlithography. Inventive imaging systems can also be used in other fields, for example in microscopy.

In the following description of preferred embodiments, the term "optical axis" denotes a straight line or a sequence of straight line segments through the centers of curvature of the optical elements. Directions and distances are described as "image-side" when they point in the direction of the image plane or of the substrate to be exposed that is located there, and as "object-side" when they are directed toward the object surface or a reticle located there with reference to the optical axis. In the examples, the object is a mask (reticle) with the pattern of an integrated circuit, another pattern, for example a grating, also being possible. In the examples, the image is projected onto a wafer provided with a photoresist layer and which serves as substrate. Other substrates, for example elements for liquid crystal displays, or substrates for optical gratings, are also possible.

Figure 1:
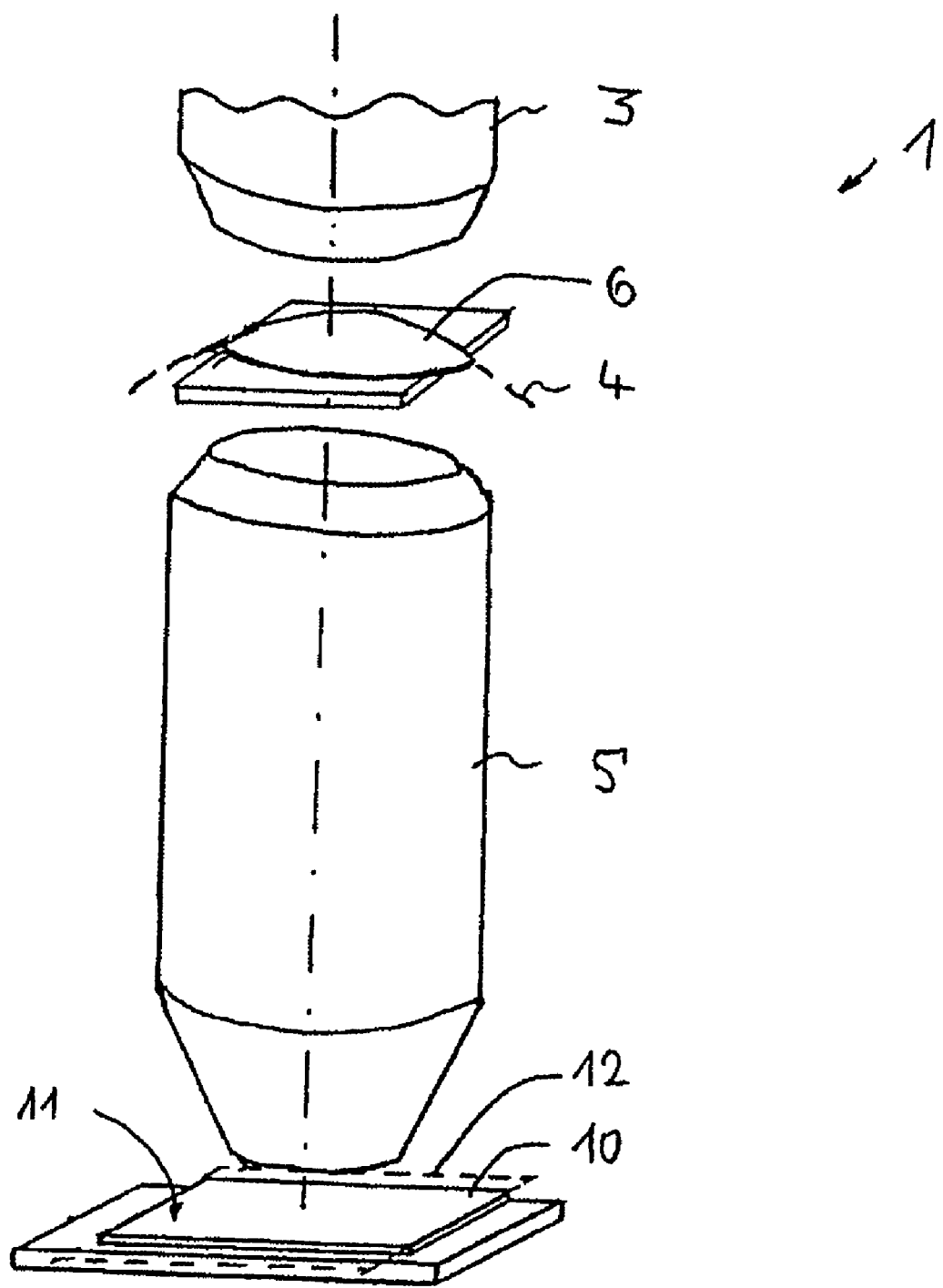
FIG. 1 schematically shows, in an oblique perspective illustration, an excerpt from a microlithography projection exposure machine in which use is made as refractive projection objective of an embodiment of an imaging objective according to the invention.

FIG. 1 schematically shows the essential component parts of a microlithography projection exposure machine in the form of a wafer stepper 1 provided for the production of large-scale integrated semiconductor components by means of projection lithography. The projection exposure machine 1 comprises, as light source, an excimer laser (not shown) having an operating wavelength of 193 nm, other operating wavelengths, for example 157 nm or 248 nm, also being possible. A downstream illumination system 3, of which only the light exit region is shown, generates in its curved exit surface 4 a large, sharply delimited illumination field that is illuminated very homogeneously and is adapted to the telecentric requirements of the downstream projection objective 5. The illumination system 3 has devices for selection of the illumination mode and, in the example, can be changed over between conventional illumination with a variable degree of coherence, annular field illumination and dipole or quadrupole illumination.

In the direction of light propagation downstream of the illumination system there is arranged a device 40 (reticle stage) for holding and manipulating a mask (reticle) 6 such that the latter lies in the object surface 4 of the projection objective 5 which is identical to the exit surface 4 of the illumination system.

Downstream of the object surface 4, the curved form of which will be explained in more detail with reference to FIG. 2, there follows at a suitable distance (object-side operating distance) the reduction objective 5, which images an image of the mask, on a reduced scale of 4:1, onto a wafer 10 coated with a photoresist layer. Other reduction scales, e.g. 5:1 or 10:1 or less, are likewise possible. The wafer 10 serving as a light-sensitive substrate is arranged such that its planar substrate surface 11 with the photoresist layer essentially coincides with the flat image surface (image plane 12, depicted in dashed fashion) of the projection objective 5. The wafer is held by a device 50 (wafer stage).

The projection objective 5 is designed for imaging an object surface 4 concavely curved relative to the projection objective into a flat image surface 12. By contrast with conventional systems, therefore, the optically mutually conjugate surfaces do not have the same state of curvature or a corresponding one transformed via the imaging scale, but an imaging process is provided that varies curvature. Here, the projection objective 5 is designed such that all aberrations, with the exception of the field curvature, are completely corrected within narrow tolerances. The field curvature, in contrast, is varied by the projection objective 5 such that a reticle 6 that is concave relative to the projection objective is imaged sharply over the entire image surface onto a planar wafer.

Figure 2:
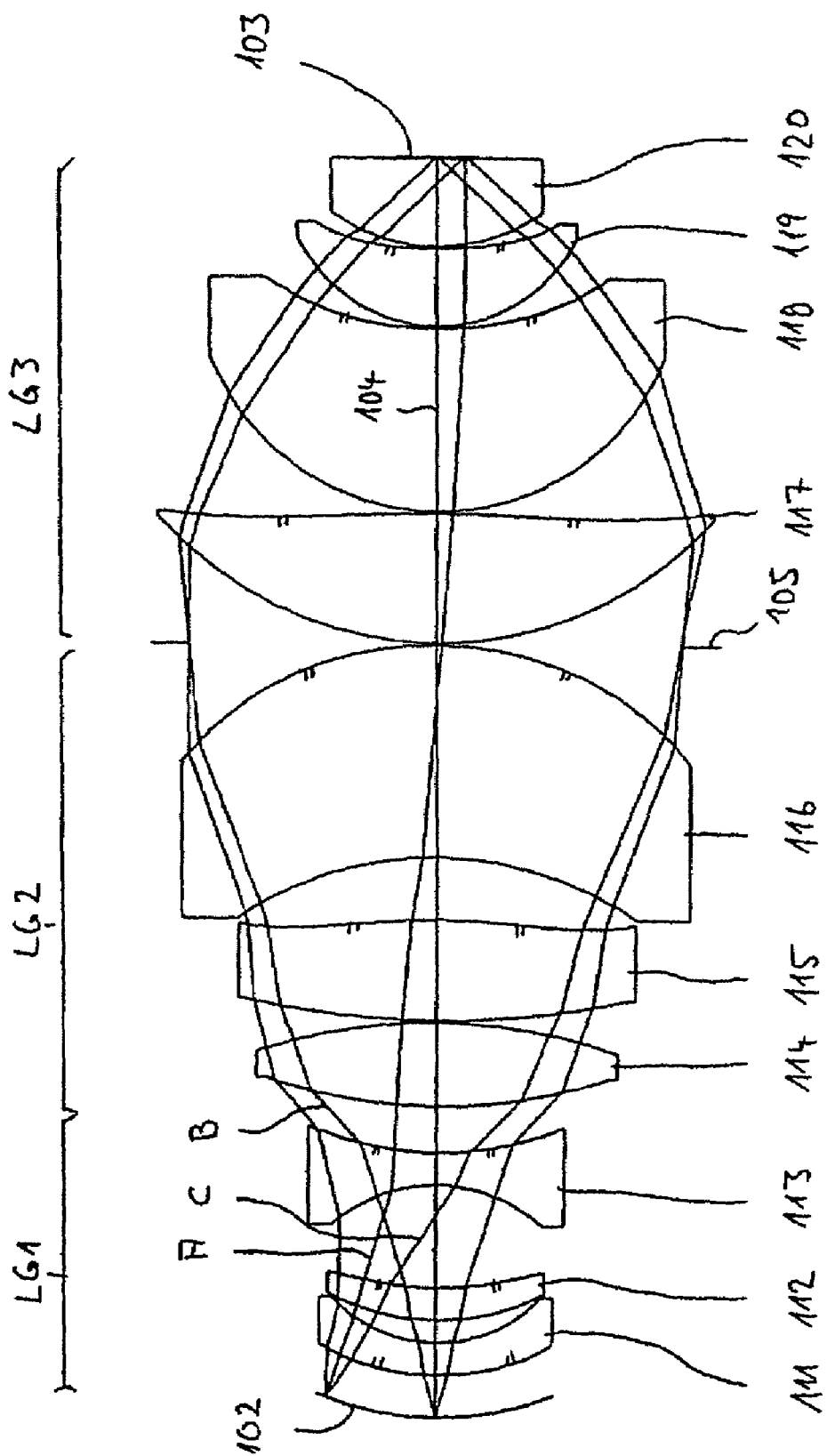
FIG. 2 shows a lens section of an embodiment of a refractive projection objective with an object surface concavely curved relative to the projection objective.

The construction of an embodiment of an inventive, purely refractive reduction objective 100 is shown with the aid of the lens section in FIG. 2, said reduction objective being an immersion objective. It serves the purpose of imaging a pattern, arranged in its object surface 102, of a reticle on a reducing scale 4:1 (imaging scale $\beta=0.25$), doing so in conjunction with virtually homogeneous immersion. Here, the system is designed such that the object surface 102 has an object surface curvature that is concave relative to the projection objective, while the image surface 103 that is optically conjugate with the object surface 102 is flat. The projection objective 100 thus introduces field curvature which precisely compensates the curvature of the object surface in the light path between object surface and image plane such that a sharp image is produced over the entire image field on a planar substrate.

The projection objective 100 is a rotationally symmetrical, purely refractively constructed projection objective that, by contrast with conventional projection objectives of this type, does not have a pronounced waist structure. The projection objective can be subdivided into three consecutive lens groups that are arranged along the optical axis 104 in a fashion centered thereon. The first lens group LG1 following the object surface 102 has a weakly negative refractive power. A second lens group LG2 following immediately thereon has a positive refractive power. A third lens group LG3 following immediately thereon likewise has a positive refractive power. The image plane immediately follows the third lens group LG3, and so the projection objective has no further lens or lens group apart from the first to third lens groups. This distribution of refractive power results approximately in a single-belly system in which a single pronounced belly, that is to say a large expansion of the beam diameter with subsequent tapering toward the image plane, exists downstream of the entrance-side lens group of negative refractive power. In a transitional region of the third to the fourth lens group, the system aperture 105, which is accessible for locating an aperture stop, is situated in the region of large beam diameter.

The imaging possible with the aid of the projection objective can be characterized by the profile of its principal rays and marginal rays. Denoted here as principal ray A is a ray that runs from an outer edge point of the object field in a fashion approximately perpendicular to the object surface and cuts the optical axis 104 in the region of the system aperture 105. A marginal ray B leads from the middle of the object field, that is to say from an axial field point, to the aperture edge of an aperture stop that is normally seated at the location of the system aperture 105 or in its immediate vicinity. A ray C that leads from an outer field point to the opposite edge of the aperture stop is denoted here as a coma ray. The perpendicular distance of these rays from the optical axis yields the corresponding ray heights $h_A$, $h_B$ and $h_C$.

The first lens group LG1 following the object surface 102 is substantially responsible for picking up with low aberration the converging radiation coming from the curved object surface 102, and for expanding the introduction into the single pronounced belly of the system (formed by lens groups LG2 and LG3). The first lens group LG1 comprises a negative meniscus lens 111, following the object surface 102, with an object-side convex surface and image-side concave surface, a positive meniscus lens 112, following thereupon, of weak refractive power and with an image-side concave surface, as well as a biconcave negative lens 113 that follows at a distance and on whose aspheric exit side relatively large incidence angles occur that are useful for aberration correction. Furthermore, the convex entrance surface of the projection objective, and the exit surface of the second lens 112, are aspheric. These two aspheres are situated in an area close to the field in which the principal ray height $h_A$ is large by comparison with the marginal ray height $h_B$, and therefore have a strong effect on field-dependent aberrations.

The second lens group LG2 begins with a bispheric, biconvex positive lens 114 that is followed by a positive meniscus 115 with a spherical entrance surface and strongly aspherized exit surface. A thick meniscus lens 116 with a concave entrance surface and aspheric exit surface terminates the second lens group.

The third lens group starts with a positive lens 117 with a spherical entrance surface and strongly aspherized exit surface that is followed by a thick positive meniscus 118 with a spherical entrance surface and aspheric exit surface that is concave toward the image. After a further positive meniscus 119 with a spherical entrance surface and aspheric exit surface, there follows a planar convex lens 120 with a spherical entrance surface and flat exit surface. The latter coincides with the image plane of the projection objective, which is thus designed as a solid immersion objective for projection lithography in the optical near field.

The specification of the design is summarized in a known way in tabular form in Table 1. Here, column 1 gives the number of a refracting surface or a surface distinguished in some other way, column 2 gives the radius r of the surface (in mm), column 3 gives the distance d, denoted as thickness, of the surface from the following surface (in mm), and column 4 gives the material of the optical components. Column 5 shows the refractive index of the material, and column 6 specifies the useful, free radii, or half the free diameters, of the lenses (in mm).

The counting of the surfaces begins from the image side, and so surface 0 corresponds to the flat exit surface of the planar convex lens, surface 8 to the system aperture, and surface 21 to the curved object surface.

Eight of the surfaces, specifically the surfaces 2, 4, 6, 9, 11, 15, 17 and 20, are aspheric in the embodiment. Table 2 specifies the corresponding aspheric data, the aspheric surfaces being calculated using the following rule:

$$p(h)=[((1/r)h^2)/(1+\text{SQRT}(1-(1+K)(1/r)^2h^2))]+C1*h^4+C2*h^6+\ldots$$

Here, the reciprocal (1/r) of the radius specifies the surface curvature, and h specifies the distance of a surface point from the optical axis (that is to say the ray height). Consequently p(h) specifies the so-called sagitta, that is to say the distance of the surface point from the surface apex in the z-direction, that is to say in the direction of the optical axis. The constants K, C1, C2, . . . are reproduced in Table 2.

The optical imaging system that can be reproduced with the aid of these data is designed for an operating wavelength of approximately 193 nm in the case of which the synthetic quartz glass used for all the lenses (apart from for the $CaF_2$ planar convex lens 120) has a refractive index n=1.5605. The image-side numerical aperture is NA=1.1. The objective has an overall length L (distance between image plane and object plane) of approximately 590 mm. The image field size is 26·5.5 mm.

The projection objective is designed by means of the construction and sequence of its lenses so as to image a substantially spherically curved object surface 102, whose center of curvature is situated on the projection objective side, with low aberration directly, that is to say without an intermediate image, into a flat image surface 103 optically conjugate therewith. Here, the projection objective introduces a field curvature that corresponds to the magnitude downstream of the curvature of the object surface and can be characterized by an object surface radius of curvature OFCR of approximately 152 mm (or by the Petzval radius $R_P$=152 mm).

Figure 3:
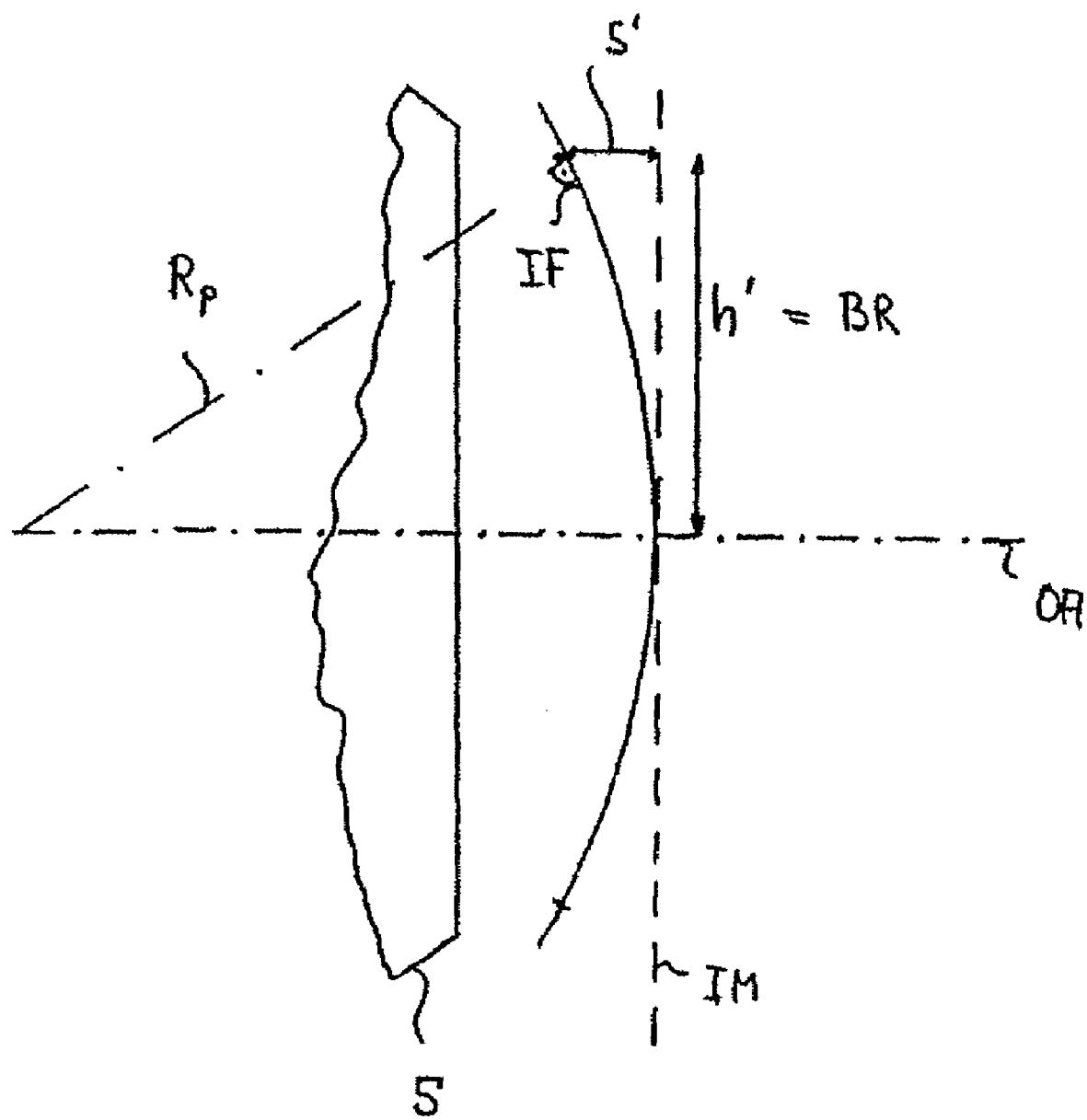
FIG. 3 shows a schematic illustration for quantifying the field curvature.

The significant field curvature of the projection objective can be described by its Petzval sum $1/R_P$ (very large by comparison with conventional projection objectives) or its Petzval radius $R_P$ (very small by comparison with conventional projection objectives). FIG. 3 shows a diagram. Here, a flat object field is imaged into a curved image field IF with the aid of a projection objective with a finite Petzval sum. The image-side end of the projection objective 5 is shown together with the area of the image field IF. The latter has an image-side field curvature s'. Here, the field curvature is parameterized by an axial deviation s', measured at the edge of the image field IF in an axially parallel direction, of the curved image field IF from a tangential plane IM that lies perpendicular to the optical axis OA and is tangent to the optical axis of the image field. The edge of the image field has a radial distance h' (image-side image height) from the optical axis OA. This corresponds to the image field radius BR. The image field IF is spherically curved to a good approximation in the cutting plane shown in FIG. 3, and so it lies on a circular arc of radius $R_P$. It then holds for the relationship between field curvature s', image field radius BR and Petzval radius $R_P$ that:

$$s' = |R_P| - \sqrt{R_P^2 - BR^2}.$$

The axial deviation s' is approximately 0.6 mm for the embodiment, and is therefore very large by comparison with the depth of focus DOF, which is approximately DOF=80 nm.

With this configuration of the object surface, it is possible largely to dispense with measures for Petzval correction of the projection objective, as a result of which it is possible to achieve a construction that is compact in the axial direction and of low mass overall. Here, lenses 111, 113 of negative refractive power are provided only in the input-end first lens group LG1, their diameter being relatively small. In this case, the axial location with minimum beam diameters is situated between the object surface and the system aperture 105 inside the first lens group LG1 between the lenses 112, 113, the beam diameter here being only slightly (approximately 10%) smaller than the object field diameter. Otherwise, the projection objective comprises exclusively positive lenses, since both all the lenses 114, 115, 116 of the second lens group LG2, and all the lenses 117, 118, 119, 120 of the lens group LG3 are of positive refractive power. By dispensing with negative lenses downstream of the first lens group LG1 and thereby being able to avoid diverging refractive powers, the lens diameters in the single belly, formed by the lenses of the second and third lens groups, of the projection objective can be kept relatively small, thus promoting a construction of low mass overall. At the same time, the number of lenses can be kept low, with a total of 10 lenses by comparison with projection objectives having one or more pronounced waists. Here, the maximum useful lens diameter, at approximately 260 mm, is smaller in absolute terms than maximum lens diameters of multi-belly systems of comparable numerical apertures. The wavefront correction is relatively slight, at approximately 8 m$\lambda$ (RMS) over the field on the side of lower numerical aperture (object side).

The object surface radius of curvature OFCR at approximately 152 mm is almost three times the object field radius OR. Favorable values for the ratio between the object surface radius of curvature OFCR and object field radius OR can be in the range between approximately 2 and approximately 6. With object surfaces curved in such a way it is possible to dispense with design measures for correcting the field curvature within the projection objective, and thereby to ensure a compact construction. The remaining aberrations can be reduced to the values usual for microlithography systems.

An imaging system of the type shown in FIG. 2, which images a curved object surface into a flat image surface without an intermediate image, can also be used as an imaging subsystem within a larger projection objective, in the case of which at least one real intermediate image is produced. In this case, the object field, situated in the curved object surface, of the imaging system can be formed by a real intermediate image that is produced by a further, upstream subsystem. In particular, use is possible within a catadioptric projection objective, in the case of which the curvature-varying, refractive component objective is arranged downstream of one or more catoptric or catadioptric component objectives, in order to image a curved last intermediate image of the overall projection objective into the image plane. The upstream catoptric or catadioptric subsystem can comprise one or more concave mirrors and, if appropriate, negative lenses in the vicinity of concave mirrors close to the pupil, in order to provide a margin of Petzval correction that leads to a curvature of the field surface in which the intermediate image is arranged that serves, in turn, as object of the last, refractive subsystem acting in a curvature-varying fashion. If the refractive subsystem acting in a curvature-varying fashion is largely corrected up to the field curvature, the upstream component objectives are to be designed such that the intermediate image, which serves as object of the refractive subsystem, is likewise largely corrected with regard to all the aberrations, with the exception of the field curvature.

The invention shows that in the case of refractive projection objectives or of purely refractively constructed, imaging subsystems of relatively large catadioptric projection objectives, there is a great potential for saving on lens material and for a compact construction when corrective measures for field flattening are largely or completely dispensed with. Imaging systems that can in this way be of compact and low-mass construction and have very high numerical apertures can be used advantageously in the field of microlithography and elsewhere. The imaging of a curved reticle onto a flat image field that is addressed here is only one example. Also possible is a microlithography method in the case of which, starting from a planar mask, a projection objective of compact and low-mass construction and having a flat object field and curved image field is used to expose a curved reticle which is then developed and then imaged onto a planar wafer with the aid of a second projection objective with a curved object field and flat image field. Both projection objectives provided for this projection method can be of low-mass construction because correction means for field flattening have been dispensed with.

In the case of projection objectives with a curved object surface, the upstream illumination system is preferably to be adapted such that its exit surface has a curvature corresponding to the object surface. If there is provided in the illumination system an imaging system that images a field plane inside the illumination system into a field surface that coincides with the object surface of the projection objective and is conjugate thereto, this imaging system can be designed according to the projection objective such that a curvature results in the field surface at the output end.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and the scope of the invention, as defined by the appended claims, and equivalents thereof.

TABLE 1

| Surface | Radius | Thickness | Material | Index | ½dia. |
|---|---|---|---|---|---|
| 0 | 0.000000 | 42.500000 | CAF2 | 1.501106 | 13.30 |
| 1 | −89.184531 | 1.000000 | | | 46.64 |
| 2 | −234.378056 | 36.412856 | SIO2 | 1.560491 | 54.10 |
| 3 | −75.000370 | 1.000000 | | | 64.21 |
| 4 | −180.030582 | 86.176957 | SIO2 | 1.560491 | 77.76 |
| 5 | −117.880061 | 1.000000 | | | 106.69 |
| 6 | 756.432280 | 61.327113 | SIO2 | 1.560491 | 127.89 |
| 7 | −178.477864 | 1.000000 | | | 129.37 |
| 8 | 0.000000 | 0.000000 | | | 118.04 |
| 9 | 172.213904 | 99.832017 | SIO2 | 1.560491 | 118.21 |
| 10 | 170.717836 | 29.470394 | | | 91.18 |
| 11 | 333.483153 | 47.281459 | SIO2 | 1.560491 | 89.82 |
| 12 | −432.201167 | 1.000000 | | | 86.89 |
| 13 | 268.227953 | 40.000823 | SIO2 | 1.560491 | 81.15 |
| 14 | −252.461604 | 21.507742 | | | 76.85 |
| 15 | −151.765511 | 15.000000 | SIO2 | 1.560491 | 56.46 |
| 16 | 77.710989 | 47.561149 | | | 46.31 |
| 17 | −154.189490 | 15.000000 | SIO2 | 1.560491 | 46.34 |
| 18 | −114.985947 | 10.646769 | | | 47.21 |
| 19 | −70.515556 | 15.000000 | SIO2 | 1.560491 | 46.81 |
| 20 | −135.165128 | 20.000000 | | | 51.45 |
| 21 | −152.480154 | | | | |

TABLE 2

| Aspheric constants | | |
|---|---|---|
| Surface 2 | Surface 4 | Surface 6 |
| K  0 | K  0 | K  0 |
| C1  −2.480792E−07 | C1  −7.470020E−08 | C1  −5.561950E−08 |
| C2  −3.548575E−11 | C2  −2.891852E−12 | C2  8.853016E−13 |
| C3  4.616696E−16 | C3  5.796354E−16 | C3  3.116014E−18 |

TABLE 2-continued

| Aspheric constants | | | | | |
|---|---|---|---|---|---|
| C4 | −6.347362E−19 | C4 | −2.038822E−20 | C4 | −4.117247E−22 |
| C5 | 7.714367E−23 | C5 | −3.918788E−24 | C5 | 4.913381E−27 |
| C6 | −3.640209E−26 | C6 | 2.119272E−28 | C6 | −1.456405E−32 |

| Surface 9 | | Surface 11 | | Surface 15 | |
|---|---|---|---|---|---|
| K | 0 | K | 0 | K | 0 |
| C1 | 1.733423E−08 | C1 | −1.272977E−07 | C1 | 1.375164E−07 |
| C2 | 3.789386E−13 | C2 | −2.350591E−12 | C2 | −2.340059E−11 |
| C3 | −1.053991E−18 | C3 | 3.757991E−18 | C3 | 6.168364E−16 |
| C4 | 9.181455E−22 | C4 | 4.293245E−21 | C4 | 1.953210E−19 |
| C5 | −6.545376E−26 | C5 | −3.613504E−25 | C5 | −2.908890E−23 |
| C6 | 3.854958E−30 | C6 | 1.616529E−29 | C6 | 3.306473E−27 |

| Surface 17 | | Surface 20 | |
|---|---|---|---|
| K | 0 | K | 0 |
| C1 | 1.343935E−07 | C1 | −2.088399E−07 |
| C2 | 2.811693E−11 | C2 | −1.147222E−11 |
| C3 | 5.752264E−15 | C3 | −4.118956E−15 |
| C4 | −2.575678E−18 | C4 | 2.336903E−18 |
| C5 | 1.019890E−21 | C5 | −9.593972E−22 |
| C6 | −2.160987E−25 | C6 | 1.169224E−25 |

What is claimed is:

1. Refractive optical imaging system for imaging an object field arranged in an object surface of the imaging system into an image field arranged in an image surface of the imaging system on a demagnifying imaging scale, comprising:

a plurality of optical elements which are configured and arranged such that a defined finite field curvature of the imaging system is set such that an object surface concavely curved relative to the imaging system is imaged into a flat image surface, wherein the imaging system is designed as a projection objective for microlithography.

2. Imaging system according to claim 1, having a depth of focus DOF and an image field of field radius BR, wherein there exists an axial deviation s', measured parallel to an optical axis of the imaging system at the edge of the image field, of the curved image surface from a plane, situated perpendicular to the optical axis and tangent to the image surface at the optical axis, in accordance with $$s' = |R_p| - \sqrt{R_p^2 - BR^2},$$

the following condition being fulfilled: $|s'| > 50 \cdot DOF$.

3. Imaging system according to claim 1, wherein the curved object surface of object surface radius OR has a finite object surface radius of curvature OFCR for at least one direction perpendicular to an optical axis of the imaging system for which it holds that:

$OFCR_{min} \leq OFCR \leq OFCR_{max}$, a minimum object surface radius of curvature $OFCR_{min}$ lying in the range between 1.5*OR and 2*OR, and a maximum object surface radius of curvature $OFCR_{max}$ lying in the range between 6*OR and 60*OR.

4. Imaging system according to claim 1, which is substantially corrected with reference to all aberrations with the exception of the field curvature.

5. Imaging system according to claim 1, which has a first lens group, of negative refractive power, immediately following the object surface, a second lens group, of positive refractive power, immediately following the first lens group, a third lens group, of positive refractive power, immediately following the second lens group, and a system aperture which is arranged in a transitional region from the second lens group to the third lens group.

6. Imaging system according to claim 5, wherein a minimum lens diameter $D_{min}$ is greater than 80% of the object field diameter such that the imaging system does not have a pronounced waist between the object surface and the imaging plane.

7. Imaging system according to claim 1, which has an overall length L which is smaller than three times a maximum lens diameter used.

8. Imaging system according to claim 1, which has an image-side numerical aperture $NA \geq 0.80$ and a number NL of lenses, wherein $NL \leq 15$.

9. Imaging system according to claim 1, wherein a first optical element following the object surface has a convex entrance surface facing the object surface.

10. Imaging system according to claim 9, wherein the entrance surface has a radius of curvature R1 which lies in the region of the object surface radius of curvature OFCR and fulfils the following condition:

$OFCR + 20\% \geq R1 \geq OFCR - 20\%$.

11. Imaging system according to claim 1, wherein the projection objective is designed as an immersion objective and has an image-side numerical aperture $NA > 1$.

12. Imaging system according to claim 1, which is designed for ultraviolet light with a wavelength of less than 260 nm.

13. Refractive projection objective for microlithography for imaging an object field arranged in an object surface of the imaging system into an image field arranged in an image surface of the imaging system on a demagnifying imaging scale, comprising:

a plurality of lenses designed to provide an image-side numerical aperture $NA \geq 0.80$, where an overall length L is smaller than three times a maximum lens diameter used.

14. Projection objective according to claim 13, which is designed for ultraviolet light with a wavelength of less than 260 nm.

15. Projection objective according to claim 13, which has a number NL of lenses, wherein $NL \leq 15$.

16. Projection objective according to claim 13, wherein the projection objective is designed as an immersion objective and has an image-side numerical aperture $NA > 1$.

17. Refractive projection objective for microlithography for imaging an object field arranged in an object surface of the imaging system into an image field arranged in an image surface of the imaging system on a demagnifying imaging scale, comprising:

a plurality of lenses designed to provide an image-side numerical aperture $NA \geq 0.80$, where a number of lenses is equal to or smaller than 15, where an overall length L is smaller than three times a maximum lens diameter used.

18. Projection objective according to claim 17, which is designed for ultraviolet light with a wavelength of less than 260 nm.

19. Projection objective according to claim 17, wherein the projection objective is designed as an immersion objective and has an image-side numerical aperture $NA > 1$.

* * * * *